United States Patent [19]

Morioka et al.

[11] 4,200,865
[45] Apr. 29, 1980

[54] PRINTED CIRCUIT BOARD CAPABLE OF BEING INSERTED AND WITHDRAWN ON ON-LINE STATUS

[75] Inventors: Takayuki Morioka; Jushi Ide, both of Hitachi, Japan

[73] Assignee: Hitachi, Ltd., Japan

[21] Appl. No.: 872,794

[22] Filed: Jan. 27, 1978

[30] Foreign Application Priority Data

Feb. 2, 1977 [JP] Japan .................................. 52-9672

[51] Int. Cl.² ............................................. H05K 1/04
[52] U.S. Cl. ..................................... 340/536; 340/501; 361/409
[58] Field of Search ............... 340/500, 501, 531, 532, 340/536; 361/58, 59, 62, 64, 81, 409, 424

[56] References Cited

U.S. PATENT DOCUMENTS

| | | |
|---|---|---|
| 3,530,360 | 9/1970 | Relation ........................... 361/62 |
| 3,993,935 | 11/1976 | Phillips et al. ..................... 361/424 |
| 4,079,440 | 3/1978 | Ohnuma et al. ................... 361/409 |

Primary Examiner—Alvin H. Waring
Attorney, Agent, or Firm—Craig and Antonelli

[57] ABSTRACT

A printed circuit board loaded with an electronic circuit and constructed to be capable of being inserted in and withdrawn from a bus line on on-line status, in which the input to or the output from the printed circuit board is locked out in response to the presence of two conditions, one is the presence of a demand for insertion or withdrawal of the printed circuit board on on-line status and the other is the presence of such a condition that no information exchange is being made between the printed circuit board and other unit connected with the bus line, thereby releasing the electrical connection between the bus line and the printed circuit board so that the printed circuit board can now be inserted in or withdrawn from the bus line on on-line status.

11 Claims, 4 Drawing Figures

PRINTED CIRCUIT BOARD CAPABLE OF BEING INSERTED AND WITHDRAWN ON ON-LINE STATUS

LIST OF PRIOR ART REFERENCES (37 CFR 1.56(a))

The following reference is cited to show the state of the art:
Japanese Patent Application Kokai (Laid-Open) No. 108,520/76

BACKGROUND OF THE INVENTION

This invention relates to printed circuit boards loaded with electronic circuits in a data processing system such as a computer, and more particularly to such a printed circuit board which is capable of being inserted in and withdrawn from a common input/output bus line (abbreviated hereinafter as an I/O bus line) on on-line status. The term "on-line status" is used to denote that status in which other unit or units connected with the I/O bus line are making or ready to make exchange of information. Therefore, the power supply line energizing the units connected to the bus line is also alive.

A great progress is now made in the functions of a data processing system such as a computer. Along with this great progress in the functions of the data processing system, there is a growing tendency toward packaging an electronic circuit into an integrated form such as IC or LSI. Also, with the development of the packaging technique, there is an increasing tendency toward employment of electronic circuit packages in order to deal with local failure of the data processing system or partial alteration of the function of the data processing system. According to a common practice, the functions of the data processing system are divided into a plurality of elementary functions or parts, and each individual elementary function or part of the functions is packaged on a single board so that, in the event of failure of the electronic circuit carried by one of the boards or when alteration of part of the functions is required, this faulty board can be replaced by a new one having the same part of the functions or by a new one having the altered part of the functions. During the replacement of the faulty board by the new one, undesirable system-down of the entire data processing system must be avoided as much as possible. Any appreciable problem would not arise when this replacement can be carried out within a very short period of time. However, in view of the scale and speed of data processing in the data processing system, the concept of "short time" according to the human consideration is in many time too long to be basically allowable for the data processing system itself. The term "board" may have various definitions depending upon the service, but it is defined herein as a printed circuit board on the premise that an electronic circuit is printed on the board. A technique which permits withdrawl of such a printed circuit board on on-line status is disclosed in Japanese Patent Application No. 32,409/75 filed Mar. 19, 1975 in the Japanese Patent Office by the common assignee of the present application and laid open Sept. 25, 1976 as Kokai (Laid-Open) No. 108,520/76. Further, U.S. patent application Ser. No. 760,523 corresponding to this Japanese patent application No. 32,409/75 was filed on Jan. 19, 1977 by the inventors, K. Ohnuma et al, of the Japanese application No. 32,409/75 and is now U.S. Pat. No. 4,079,440, issued Mar. 14, 1978. The printed circuit board or plug-in package loaded with an electronic circuit and disclosed in this Japanese Patent Application Kokai (Laid-Open) No. 108,520/76 and corresponding U.S. patent application Ser. No. 760,523, is characterized in that the printed circuit board comprises at least two connector plugs for power supply. The connector plugs are arranged such that the outer end of one of them is more projected outwardly from the board than that of the other and that the two connector plugs are connected to each other through an impedance element. The other connector plug is connected to the electronic circuit loaded in the circuit board through an inductance element so as to supply electric power thereto. The circuit board further comprises a grounding terminal connected to a ground line of the electronic circuit and a locking terminal connected by a locking line for a signal from a signal stage of the electronic circuit, so that the grounding terminal and the locking terminal are adapted to be electrically connected to the ground during the insertion or withdrawal of the printed circuit board.

The disclosed printed circuit board (abbreviated hereinafter as a PCB) having such a structure can be inserted in and withdrawn from a common I/O bus line on on-line status and has thus obviated the defect of creating an electrical disturbance in the bus line during the insertion and withdrawal.

However, the disclosed PCB having such connector plugs permitting the insertion and withdrawal on on-line status is still quite insufficient to be put into practical use. This is because the insertion or withdrawal of the PCB in the stage of exchange of data between the computer and the input/output unit (abbreviated hereinafter as an I/O unit) associated with the PCB in question will destory the data processing operation since the PCB is inserted or withdrawn in the course of the data processing operation. With the disclosed PCB, it is impossible to obviate such a drawback.

In order to obviate such a drawback, the PCB must be inserted or withdrawn on on-line status at the timing at which this specific PCB is not participating in the exchange of data between the associated I/O unit and the computer through the bus line. That is, a suitable solution must be found to select the proper timing. For example, a state for artificially inhibiting the data exchange between the computer and the associated I/O unit through the PCB must be established, or the absence of the data exchange between the computer and the associated I/O unit through the PCB must be exactly detected for the successful insertion or withdrawal of the PCB on on-line status at the exact timing. However, it is impossible as a matter of fact to exactly detect the above timing for the successful insertion or withdrawal of the PCB on on-line status. This is because the data transfer speed of the computer is too high to be compared with the manipulating speed of the operator. Therefore, a special method has been adopted hitherto. According to this method, the operator makes necessary preparation on the program before the insertion or withdrawal of the PCB on on-line status thereby equivalently disconnecting the associated I/O unit from the bus line, that is, preventing, on the program, the central processor unit (abbreviated hereinafter as a CPU) from making data exchange with the associated I/O unit connected with the bus line, so that the data exchange between the computer and the specific I/O unit can be artificially inhibited. However, this method is defective in that the operator may key in an erroneous number instead of the correct number of the specific I/O unit, resulting in the danger of giving rise to objectionable system-down of the computer. Further, much more information must be keyed in by the operator for the insertion and withdrawal of a plurality of PCB's each controlling an associated I/O unit. Thus, the prior art method is also defective in that the necessity for the keying-in of such excessive information results in a reduced efficiency and an increase in the possibility of keying-in of an erroneous number.

SUMMARY OF THE INVENTION

It is a primary object of the present invention to obviate the prior art defects pointed out above.

Another object of the present invention is to provide a novel and improved PCB capable of being inserted in and withdrawn from an I/O bus line on on-line status without the necessity for especial preparation on the program by the operator and without adversely affecting other PCB's connected with the same power supply line and/or the same bus line to which the specific PCB is connected.

The PCB according to the present invention is featured by the fact that it can be inserted in and withdrawn from the bus line on on-line status only when no data communication (information exchange) is being made between the associated I/O unit and the bus line through the PCB in the presence of the demand for the insertion and withdrawal of the PCB on on-line status. The present invention will now be described in detail with reference to the accompanying drawings.

DETAILED DESCRIPTION OF THE INVENTION

For a better understanding of the present invention, prior art examples including Japanese Patent Application Kokai (Laid-Open) No. 108,520/76 and corresponding copending U.S. patent application Ser. No. 760,523 cited hereinbefore will be described before describing preferred embodiments of the present invention in detail.

Figure 1:
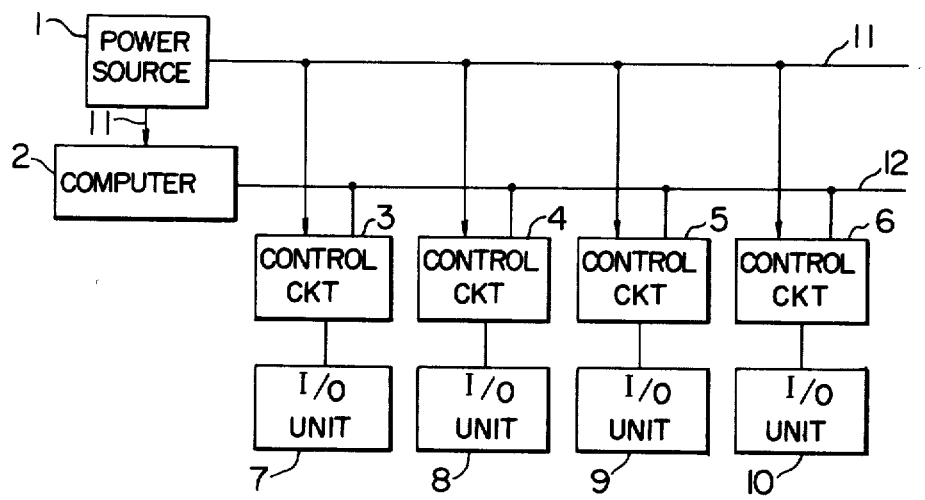
FIG. 1 is a block diagram of a computer system to which the present invention is most preferably applied.

FIG. 1 is a simplified block diagram of a data processing system of the type using a common I/O bus line. Referring to FIG. 1, a computer 2 is connected by a common I/O bus line 12 with a plurality of I/O units 7, 8, 9 and 10 for data exchange with these units. A bus control unit (not shown) is provided for the general traffic control of data being exchanged between the computer 2 and the I/O units 7 to 10. The traffic control of data transmission and reception between the common I/O bus line 12 and the I/O units 7 to 10 is carried out by individual control circuits 3, 4, 5 and 6. A power source 1 supplies its power supply voltage to the computer 2 and the control circuits 3, 4, 5 and 6 through a power supply line 11. Each of these control circuits 3, 4, 5 and 6 is provided in the form of a single PCB, and these PCB's are mounted in tiers in the form of a stack.

It may be necessary to withdraw one or more of these PCB's for fault remedying or maintenance purpose on on-line status in which the power supply voltage is continuously supplied to permit continuous data communication. This withdrawal of one or more of the PCB's creates naturally a disturbance in the flow of signals on the I/O bus line 12 and results also in a variation in the line voltage on the power supply line 11. Although the power supply line 11 is shown by a single line in FIG. 1, it consists actually of a plurality of line elements supplying voltages of, for example, $\pm 5$ volts, $\pm 24$ volts, and $\pm 12$ volts respectively. Thus, these voltages supply line elements are affected by the withdrawal of one or more of the PCB's. The bus line 12 includes also a plurality of signal line elements such as data exchange signal line elements and control signal line elements. Further, although the power supply line 11 is shown disposed independently of the bus line 12, the former may naturally be included in the latter according to a wider concept. The power source 1 may be disconnected from the system during the insertion or withdrawal of a PCB in order to prevent these lines 11 and 12 from being adversely affected by the insertion or withdrawal of the PCB. However, a single power source is presently used in many systems to energize a plurality of PCB's which control a plurality of I/O units respectively. This owes to the fact that the modern progress in the packaging technique and large scale integration technique has made it possible to greatly increase the internal packaging density of PCB's. In such a system, disconnection of the single power source for the purpose of remedying a partial fault of a PCB controlling an associated I/O unit or for the purpose of maintenance exerts a bad effect on the entire system supplied by the single power source.

In order to avoid the above trouble, it becomes necessary to permit insertion or withdrawal of a PCB without adversely affecting other PCB's connected with the same power source or the same bus line in the state in which the power source is kept connected with the system, that is, in the alive and on-line status so that such a PCB can be installed in the system as an additional one or withdrawn from the system for the purpose of maintenance.

Figure 2:
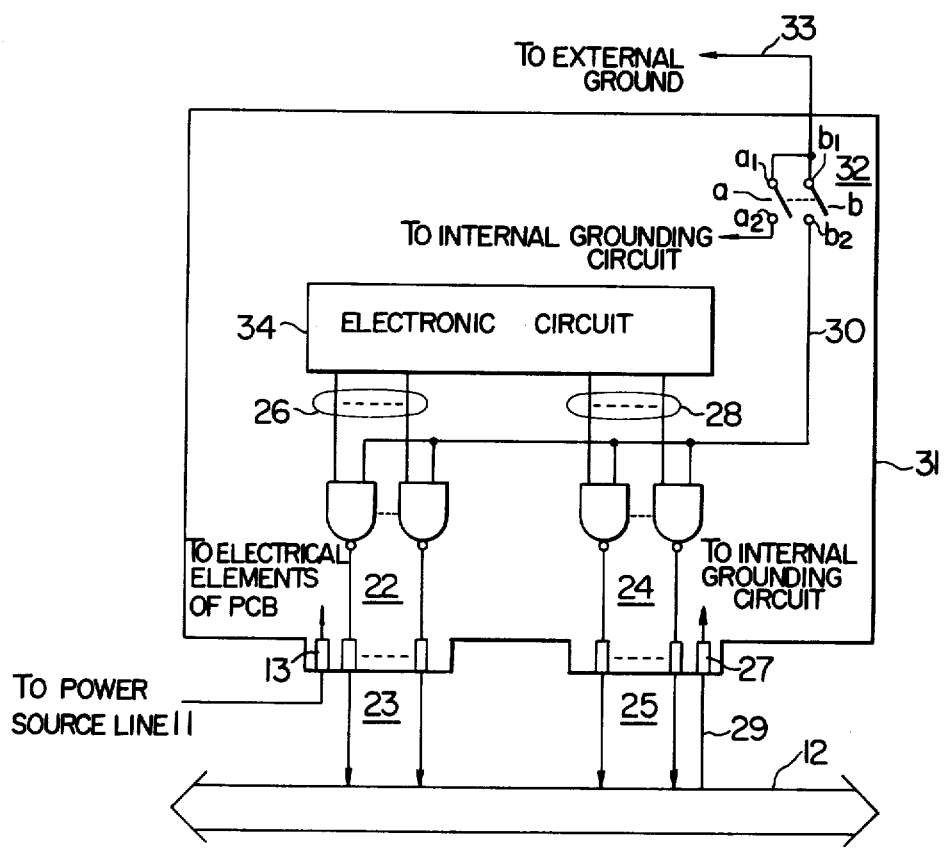
FIG. 2 is a circuit diagram of a prior art PCB employed in the system shown in FIG. 1.

FIG. 2 shows the structure of a prior art PCB which is proposed so as to be capable of being inserted and withdrawn on on-line status.

Referring to FIG. 2, the prior art PCB designated generally by the numeral 31 comprises an electronic circuit 34. This electronic circuit 34 is the circuit part loaded on the PCB 31 itself, and in as much as its internal operation may have various modes, and it may be designed in any desired manner, detailed description of the circuit operation and design will be omitted. This electronic circuit 34 is connected at its outputs with a plurality of control signal lines 26 and data signal lines 28. The number of these control signal lines and data signal lines is determined by the function of the PCB 31 and is basically selected to suit the desired design.

The PCB 31 having such a structure includes a plurality of control signal NAND gates 22 connected with the individual control signal lines 26, and a plurality of data signal NAND gates 24 connected with the individual data signal lines 28. One of the control signal lines 26 is connected with one of the two inputs of each NAND gate 22, and one of the data signal lines 28 is connected with one of the two inputs of each NAND gate 24. The PCB 31 includes further a lockout switch 32 consisting of a pair of switches a and b arranged for interlocking operation. The movable contact $a_1$ of the switch a and the movable contact $b_1$ of the switch b are externally grounded through a common line 33. The stationary contact $a_2$ of the switch a is connected with an internal grounding circuit of the PCB 31. This internal grounding circuit of the PCB 31 is connected through a line 29 with a common grounding line element included in the bus line 12. Individual grounding points of the electronic circuit 34 are connected with this internal grounding circuit of the PCB 31 to be grounded through the line 29 and through the common grounding line element in the bus line 12, so that these points are held at the same potential as those of the electronic circuits connected with the internal grounding circuits of the other PCB's. The PCB 31 is connected with the bus line 12 through a plurality of control signal connector plugs 23 having the output lines of the respective control signal NAND gates 22 connected therewith, through a plurality of data signal connector plugs 25 having the output lines of the respective data signal NAND gates 24 connected therewith, and through a plug 27 connected with the internal grounding circuit of the PCB 31. Further, the power from the source 1 is introduced into the PCB 31 through the line 11 and a power source plug 13. The PCB 31 is inserted in and withdrawn from the bus line 12 at the edge having these plugs 13, 23, 25 and 27.

The stationary contact $b_2$ of the switch b is connected with the other terminal of the control signal NAND gates 22 and with the other terminal of the data signal NAND gates 24.

An I/O unit (not shown) associated with this PCB 31 is connected with the bus line 12 through the PCB 31. Depending upon the function of the associated I/O unit, a plurality of NAND gates (not shown) providing input circuits for application of input signals from the bus line 12 to the electronic circuit 34 may be additionally provided and connected in a direction or polarity opposite to that of the NAND gate groups 22 and 24 provided for the exclusive purpose of application of the output signals of the electronic circuit 34 to the bus line 12. In another case, the NAND gate groups 22 and 24 providing the signal output circuits may not be provided, and the NAND gate groups functioning exclusively as the signal input circuits may merely be provided. However, even when the NAND gate groups functioning as the signal input circuits are provided, their lockout function described later is similar to that of the NAND gate groups 22 and 24 providing the signal input circuits, and therefore detailed description of the former NAND groups will not be given herein. The electronic circuit 34 shown in FIG. 2 is connected with the power supply line 11 shown in FIG. 1 by means of plugs provided for this purpose, but such plugs are similar to the plugs 23 and 25 and not shown for the simplicity of illustration. Further, this electronic circuit 34 is connected with a control signal line provided separately from the common bus line 12 so that it may be controlled singly or in common with the electronic circuit or circuits of one or more of the other PCB's connected with the common bus line, but illustration and description of such a separate control signal line and connector plug for connecting such control signal line will be also omitted. Furthermore, illustration and description of electrical connecting means will also be omitted although the electronic circuit 34 is electrically connected by such means with the associated I/O unit (not shown) connected with the PCB 31.

In the PCB 31 having such a structure, the switches a and b constituting the lockout switch 32 are normally kept open. Suppose now that this PCB 31 is connected with the bus line 12. In this state, the internal grounding circuit of the PCB 31 is connected with the common grounding line element in the bus line 12 through the plug 27 and line 29 to be maintained at the same potential as the common grounding line element, since the lockout switch 32 is normally kept in the open position. This lockout switch 32 is first closed when it is desired to withdraw or disconnect the PCB 31 from the bus line 12 in the above state. As a result of the closure of the lockout switch 32, the internal grounding circuit of the PCB 31 is connected with the common grounding line element in the bus line 12 through the plug 27 and line 29, and at the same time, externally grounded through the switch a and line 33. Thus, not only the PCB 31 is prevented from being placed in a floating state due to the fact that the electronic circuit 34 is kept externally grounded even when the plug 27 is disengaged earliest of all the plugs, but also one input of each of the NAND gates 22 and 24 is externally grounded thereby placing these NAND gates 22 and 24 in their lockout state to inhibit appearance of output signals from the NAND gates 22 and 24 despite application of the output signals to the lines 26 and 28 from the electronic circuit 34. The PCB 31 is withdrawn with its plugs disengaged from the bus line 12 in the state above described.

The PCB 31 can be similarly inserted in the bus line 12. In this case, the lockout switch 32 is first closed to externally ground the internal grounding circuit of the PCB 31, and then the PCB 31 is connected at its plugs with the bus line 12. Upon connection of the plugs, the lockout switch 32 is opened to release the NAND gates 22 and 24 from their lockout state. It will be seen that the PCB having such a structure can be inserted in or withdrawn from the common bus line on on-line status without giving rise to an electrical disturbance in the signals on the common bus line and the line voltage on the power supply line. In summary, the proposed PCB is advantageous in that the internal grounding of the PCB can be fully stably attained, and the complete lockout function for the output lines can be realized.

However, the proposed structure is not still fully effective in obviating prior art defects as pointed out hereinbefore. For example, the proposed PCB is still defective in that the information exchange operation itself will be destroyed when the PCB is withdrawn from the common bus line while the I/O unit connected with the common bus line through this PCB is making exchange of information with the computer.

Figure 3:
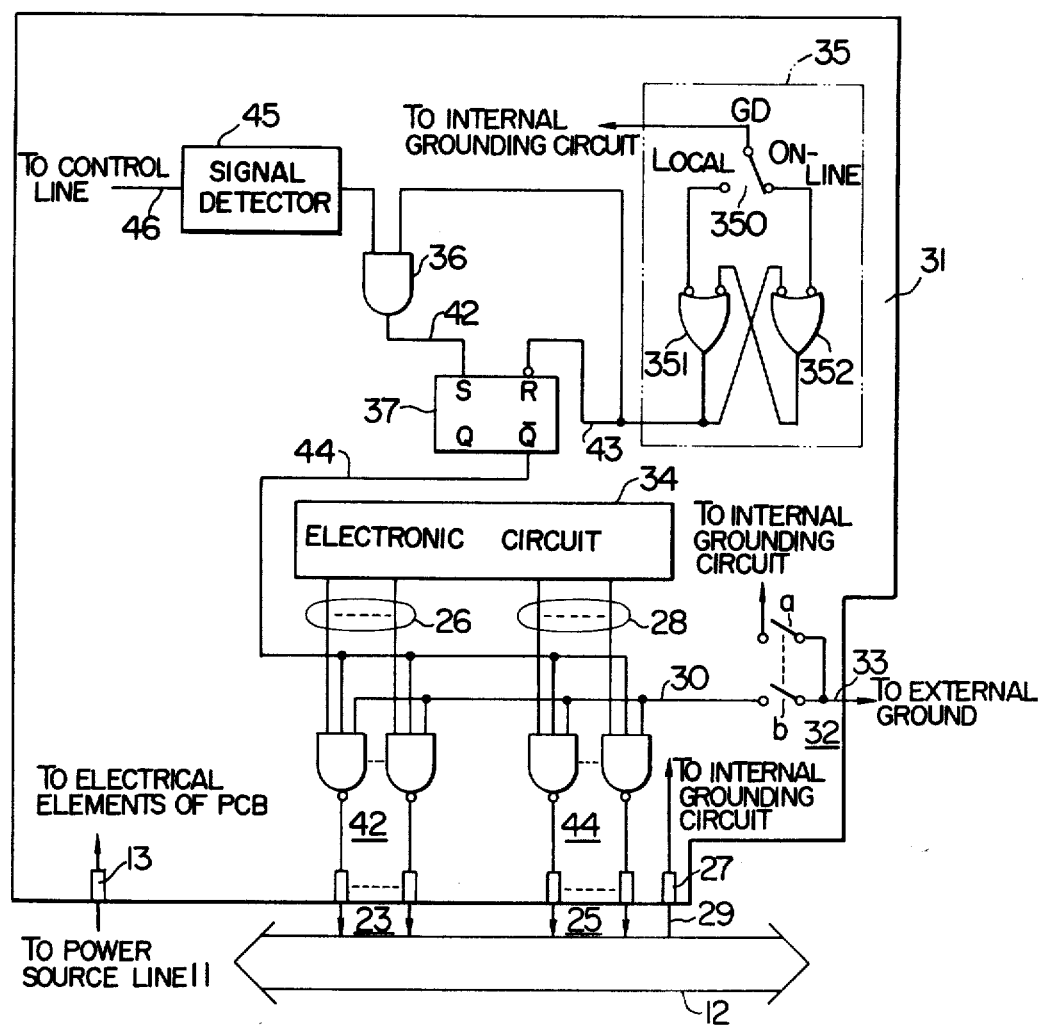
FIG. 3 is a circuit diagram of an embodiment of the PCB according to the present invention which is preferably employed in the system shown in FIG. 1.

FIG. 3 shows the structure of an embodiment of the present invention which obviates such a defect. In FIG. 3, the same reference numerals are used to denote the same ports appearing in FIG. 2. The PCB 31 shown in FIG. 3 comprises, in addition to the elements shown in FIG. 2, a signal detecting circuit 45 which detects the absence of data transmission and reception between the computer 2 and the associated I/O unit. This signal detecting circuit 45 is connected at its input with a signal line 46 which applies a control signal controlling the operation of this PCB 31. That is, this signal line 46 applies a control signal to the PCB 31 to instruct starting and termination of its operation, and may be a signal line element included in the common bus line 12 to be connected in common to all the PCB's connected with the bus line 12. Also, this signal line 46 may be provided separately from the common bus line 12 to serve exclusively for the control of the associated PCB 31, or may be connected in common to some of the PCB's connected with the common bus line 12.

The PCB 31 shown in FIG. 3 comprises further a switching circuit 35, and AND gate 36 and a flip-flop 37. The PCB 31 further comprises a plurality of NAND gates 42 and 44 which serve the same purposes as those of the control signal NAND gates 22 and data signal NAND gates 24 in FIG. 2, but have three input terminals respectively. Input gates may be provided besides these output gates 42 and 44, or input gates may only be provided in place of these output gates 42 and 44 as described with reference to FIG. 2. Herein, the PCB 31 will be considered to include the output gates 42 and 44 only. It will be readily understood that the operation of input gates is entirely the same as that of the output gates, and any description of such input gates is unnecessary.

The switching circuit 35 includes a switch 350 and a flip-flop consisting of a pair of NAND gates 351 and 352. The switch 350 includes a pair of stationary contacts labeled "LOCAL" and "ON-LINE" respectively and a movalle contact labeled GD. The stationary contact "LOCAL" is connected with one of the two inputs of the NAND gate 351, and the other stationary contact "ON-LINE" is connected with one of the two inputs of the NAND gate 352. The other input of the NAND gate 351 is connected with the output of the NAND gate 352, and the other input of the NAND gate 352 is connected with the output of the NAND gate 351. The movable contact GD movable between the pair of stationary contacts "LOCAL" and "ON-LINE" is connected with the internal grounding circuit of the PCB 31. The output of the NAND gate 351 is applied to one of the two inputs of the AND gate 36 and to the inverted reset input R of the flip-flop 37 by a line 43. The output of the signal detecting circuit 45 is connected with the other input of the AND gate 36, and the output of this AND gate 36 is applied by a line 42 to the set input S of the flip-flop 37. The structure shown in FIG. 3 is generally the same as that shown in FIG. 2 in that the output signals from the electronic circuit 34 are applied to the first inputs of the NAND gates 42 and 44 respectively, and the second outputs of these NAND gates 42 and 44 are externally grounded through the switch 32 and line 33, as in the case of the NAND gates 22 and 24 shown in FIG. 2. However, the structure shown in FIG. 3 differs from that shown in FIG. 2 in that the output Q̄ of the flip-flop 37 is connected with the third inputs of the individual NAND gates 42 and 44.

The operation of the PCB structure shown in FIG. 3 will be described with reference first to the withdrawal of the PCB 31 from the bus line 12 on on-line status. When the PCB 31 is participating or is ready to participate in the data transmission and reception between the computer 2 and the assoicated I/O unit, the movable arm GD of the switch 350 is in contact with the stationary contact "ON-LINE", and an output signal of logical level "0" appears on the output line 43 of the NAND gate 351. This signal is then inverted to provide a signal of logical level "1" which is applied to the reset input R of the flip-flop 37 to reset the same. Thus, an output signal of logical level "1" appears at the output Q̄ of the flip-flop 37 to be applied to the respective third inputs of the individual NAND gates 42 and 44. Due to the appearance of the signal of logical level "0" on the line 43, an output signal of logical level "0" appears on the output line 42 of the AND gate 36 and is maintained in that level regardless of the level of the output signal of the signal detecting circuit 45. Therefore, "0" is applied to the set input S of the flip-flop 37. Since the switch 32 is in its open position, the second inputs of the individual NAND gates 42 and 44 are also maintained at their high level or logical level "1". Therefore, the individual NAND gates 42 and 44 are ready to permit transmission of signals, that is, these gates 42 and 44 are placed in their non-lockout state.

Withdrawal of the PCB 31 having such an internal state from the common bus line 12 will now be discussed. Before withdrawing the PCB 31 from the common bus line 12, the movable arm GD of the switch 350 is brought also contact with the stationary contact "LOCAL" by switching over it from the previous position in contact with the stationary contact "ON-LINE". Consequently, an output signal of logical level "1" appears at the output of the NAND gate 351 to be applied to one of the two inputs of the AND gate 36. However, no output signal appears from the signal detecting circuit 45 at this time when the PCB 31 is participating in the information exchange between the computer and the associated I/O unit. Thus, at this time, the signal of logical level "0" is applied to the other input of the AND gate 36, and an output signal of low level or logical level "0" appears on the output line 42 of the AND gate 36. Consequently, the flip-flop 37 is not set and is still maintained in the reset state, and the information exchangeable state is maintained between the PCB 31 and the common bus line 12 through the NAND gates 42 and 44. Upon termination of the information exchange between the PCB 31 and the bus line 12, an output signal of high level or logical level "1" appears at the output of the signal detecting circuit 45, and an output signal of logical level "1" appears on the output line 42 of the AND gate 36. In response to the application of such a signal to the set input S of the flip-flop 37, it is set, and an output signal of low level or logical level "0" appears at its output Q̄. Consequently, the individual NAND gates 42 and 44 are placed in their lockout state.

However, the following should be noted during the withdrawal of the PCB 31 from the common bus line 12. That is, the potential at the movable arm GD of the switch 350 in the switching circuit 35, hence, the potential of the internal grounding circuit of the PCB 31 is not always completely maintained at the reference grounded potential during the period of time in which the PCB 31 to be withdrawn has been completely withdrawn from the common bus line 12. This is because the potential of the internal grounding circuit of the PCB 31 tends to be placed in a floating state when the grounding plug 27 is disengaged earlier than the remaining plugs during the withdrawal of the PCB 31 from the bus line 12. The double switch 32, which is the same as that shown in FIG. 2, is provided to ensure grounding of the internal grounding circuit of the PCB 31 during this period of time, that is, from the beginning of withdrawal to the end of complete withdrawal of the PCB 31. The switches a and b constituting the double switch 32 are externally grounded at their movable contacts in common, and the stationary contact of the switch a is connected with the internal grounding circuit of the PCB 31, while the stationary contact of the switch b is connected to the second inputs of the individual NAND gates 42 and 44. In response to the closure of the switch 32, all the NAND gates 42 and 44 are placed in the lockout state to inhibit transmission of the output signals of the electronic circuit 34, and the internal grounding circuit of the PCB 31 is externally grounded. Thus, the grounding of the internal grounding circuit of the PCB 31 is ensured. The closing timing for the switch 32 must be such that the switch 32 is closed after the flip-flop 37 has been set from its reset state. Such timing is required because the PCB 31 may be still participitating in the data communication or information exchange at the time at which the switch 35 is switched over to the "LOCAL" position in response to the demand for withdrawal of the PCB 31, and the closure of the switch 35 at that time places the NAND gates 42 and 44 in their lockout state thereby destroying the information exchange operation. The inversion of the flip-flop 37 from its reset state to its set state means that information exchange is not being carried out as described hereinbefore. Thus, the PCB 31 can be reliably disconnected electrically from the bus line 12 in a double meaning.

The above description has referred to the withdrawal of the PCB 31 from the bus line 12 on on-line status. The steps for inserting the PCB 31 in the bus line 12 on on-line status are entirely reverse to those above described. In the first step, the switch 32 is closed. In the second step, the movable arm GD of the switch 350 in the switching circuit 350 is brought into contact with the stationary contact "LOCAL". The PCB 31 is then inserted in the bus line 12. After inserting the PCB 31 in the bus line 12, the switch 32 is opened to disconnect the NAND gates 42 and 44 from the external grounding thereby applying "1" to the second inputs of the individual NAND gates 42 and 44. In such a state, however, whether the NAND gates 42 and 44 have been released from the lockout state or not is still unknown. It is thus necessary to confirm whether the switch 350 has then been switched over to the "ON-LINE" position or not, and when the switch 350 is detected to be still in the "LOCAL" position, it becomes necessary to switch over it to the "ON-LINE" position. When the switch 350 is placed in its "ON-LINE" position, the flip-flop 37 is reset, and an output signal of logical level "1" appears at the output $\bar{Q}$ of the flip-flop 37. This signal is applied to the third inputs of the individual NAND gates 42 and 44 together with "1" applied to the second inputs of these NAND gates 42 and 44, thereby releasing all the NAND gates 42 and 44 from their lockout state. In this case, the switch 350 may be switched over to the "ON-LINE" position either before or after the insertion of the PCB 31 in the bus line 12. This is because the NAND gates 42 and 44 are positively kept in their lockout state during the period of the PCB inserting operation by externally grounding through the line 30 by the switch 32.

The structure of the signal detecting circuit 45 may be suitably selected depending upon the type of the control signal or selection signal appearing on the control line 46. For example, the signal detecting circuit 45 may merely be an inverter when the type of the control signal or selection signal appearing on the signal line 46 is such that it takes normally a low or "0" level and is turned into a high or "1" level when the specific PCB 31 is selected to participate in the exchange of information. In such a case, an output signal of "1" level appears from the inverter when no information exchange is made by the PCB 31. The signal detecting circuit 45 may be a bistable multivibrator when the control signal or selection signal is a pulse signal which includes a pulse instructing the start of selection of the specific PCB 31 and another pulse instructing the end of selection of the PCB 31. Thus, the signal detecting circuit 45 may any one of known circuits constructed to generate an output signal of "1" level when the specific PCB 31 is not selected to participate in the information exchange.

Figure 4:
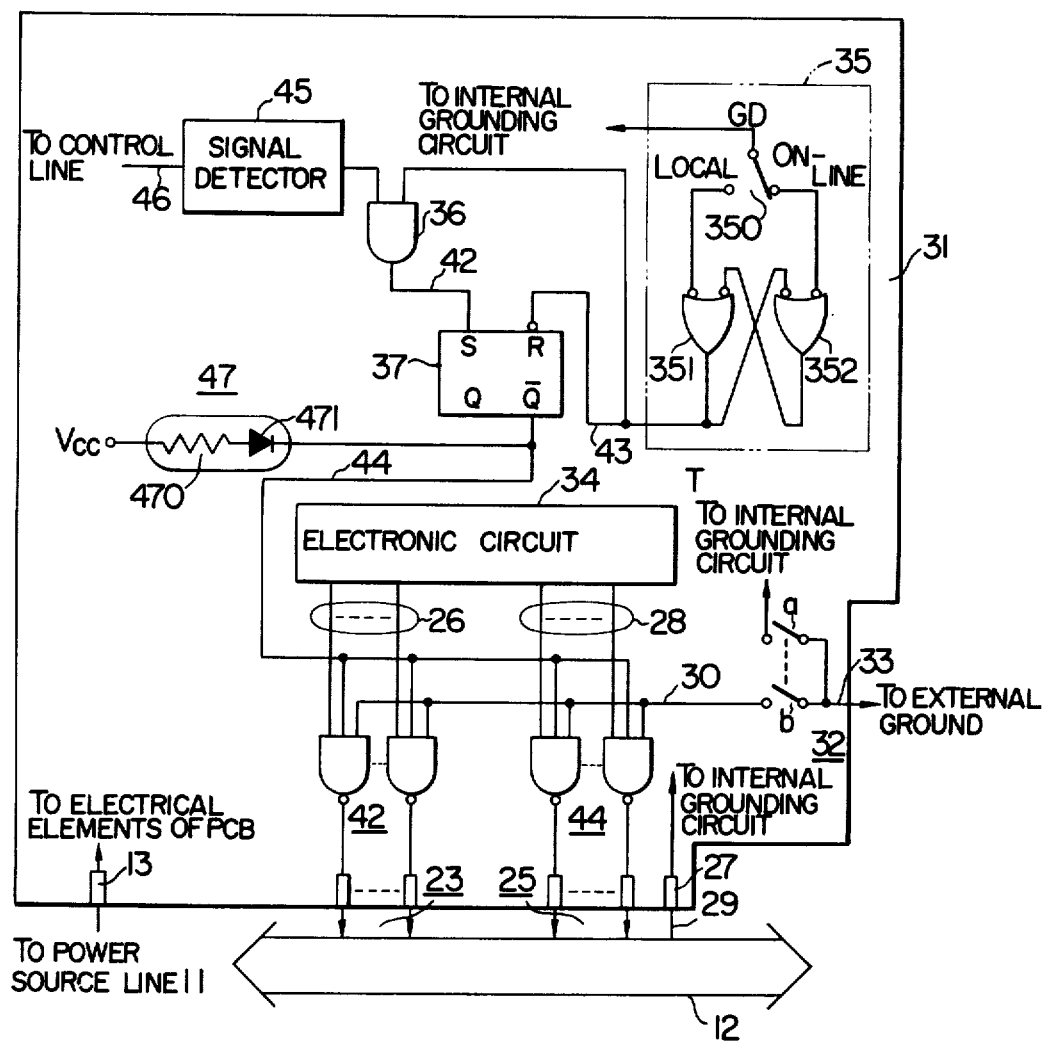
FIG. 4 is a circuit diagram of another embodiment of the PCB according to the present invention which is preferably employed in the system shown in FIG. 1.

FIG. 4 shows the structure of another embodiment of the present invention. The embodiment shown in FIG. 4 is a modification of that shown in FIG. 3 and differs from the latter in that an additional means is provided so as to externally confirm whether the individual NAND gates 42 and 44 are placed in the lockout state in the circuit state in which the switch 32 is not closed. This additional means is a display element 47 consisting of a resistor 470 and a light emitting diode 471. This display element 47 is connected between the output $\bar{Q}$ of the flip-flop 37 and a constant voltage source $V_{cc}$. According to this arrangement, the diode 471 does not emit light when "1" appears at the output $\bar{Q}$ of the flip-flop 37, but it emits light when "0" appears at the output $\bar{Q}$ of the flip-flop 37, that is, in the lockout state of the NAND gates 42 and 44 so as to inform to the exterior of the fact that the PCB is now capable of being withdrawn on on-line status.

The steps for the withdrawal of the PCB 31 on on-line status will be described. In the first step, the switch 350 is switched over to the "LOCAL" position. When the output signal of the signal detecting circuit 45 is in its "1" level, that is, when the PCB 31 is not participating in the information exchange, "0" appears at the output $\bar{Q}$ of the flip-flop 37 to place the NAND gates 42 and 44 in their lockout state. At the same time, the light emitting diode 471 emits light. The operator confirms the emission of light from the diode 471 and finds that the PCB 31 can now be withdrawn on on-line status. The switch 32 is then closed so that the ground potential can be held in the internal grounding circuit, especially, in the electronic circuit 34 of the PCB 31 during the period of time of from the beginning to the end of complete withdrawal of the PCB 31 and so that the NAND gates 42 and 44 can be reliably held in the lockout state. The PCB 31 is withdrawn from the bus line 12 in such a state of the elements.

The steps for the insertion of the PCB 31 include closing the switch 32, inserting the PCB 31, and switching over the switch 350 to the "ON-LINE" position. These steps are entirely the same as those described with reference to FIG. 3. Consequently, data communication can now be made between the computer 2 and the I/O unit through the PCB 31 and bus line 12.

The information that a PCB is being inserted or withdrawn on on-line status need not necessarily be transmitted to the computer. The reason therefor will be considered on the withdrawal of a PCB on on-line status. When a PCB is withdrawn on on-line status according to the above steps without giving any disturbance to the bus line and computer, this is equivalent to the disappearance of the response of the specific PCB when viewed from the side of the computer. As a consequence, this specific PCB may be regarded to be the same as that withdrawn due to its faulty operation, and the conventional down-dealing means or backup means (either software or hardware) in the computer may be actuated to select another PCB associated with one of the remaining I/O units so that data communication can now be made between the selected I/O unit and the computer. The same applies to the insertion fo the PCB on on-line status.

In the embodiments of the present invention described hereinbefore, the PCB has been illustrated in the form including the output gates only. However, it is apparent that the present invention is equally effectively applicable to a PCB which is provided with both the output gates and the input gates or the input gates only. Further, although the relation between a computer and I/O units has been merely illustrated, the present invention is in no way limited to such a specific case. It is apparent that the present invention is generally applicable to all kinds of data communication between data processors using a common bus line for the data communication.

We claim:

1. A printed circuit board loaded with an electronic circuit and constructed to be capable of being inserted in and withdrawn from a common input/output bus line on on-line status comprising:
   first means for electrically connecting said electronic circuit with said bus line;
   second means for generating a first output signal in response to the demand for the insertion or withdrawal of said printed circuit board on on-line status;
   third means for detecting whether or not said printed circuit board is making exchange of information through said bus line with other unit connected electrically with said bus line, thereby generating a second output signal indicative of the absence of the information exchange; and
   fourth means for disabling said first means in response to the simultaneous presence of said first and second output signals to release the electrical connection between said printed circuit board and said bus line thereby avoiding an electrical influence which may be exerted by said printed circuit board on said bus line during the insertion and withdrawal on on-line status.

2. A printed circuit board as claimed in claim 1, wherein said electronic circuit includes an internal grounding circuit associated therewith, said first means including first connecting means for disconnectably connecting said internal grounding circuit with a grounding line element included in said bus line, and wherein said fourth means includes first externally grounding means actuated during the insertion or withdrawal of said printed circuit board on on-line status for externally grounding said internal grounding circuit.

3. A printed circuit board as claimed in claim 2, wherein said first means includes second connecting means for disconnectably electrically connecting said electronic circuit with said bus line and a first logic circuit disposed between said electronic circuit and said second connecting means thereby selectively enabling exchange of information therebetween, said second means including a second logic circuit generating said first output signal in response to the demand for the insertion or withdrawal of said printed circuit board on on-line status, said third means including a third logic circuit generating said second output signal in the absence of said information exchange, and wherein said fourth means includes a fourth logic circuit generating a third output signal in response to the simultaneous presence of said first and second output signals thereby disabling said first logic circuit, and second externally grounding means arranged for interlocking operation with said first externally grounding means for externally grounding said first logic circuit thereby disabling said first logic circuit.

4. A printed circuit board as claimed in claim 1, further comprising fifth means for visually displaying the releasable state of the electrical connection by said fourth means.

5. A printed circuit board as claimed in claim 3, wherein said printed circuit board comprises sixth means actuated in response to said third output signal for visually displaying the presence of said output signal, and wherein said first and second externally grounding means are actuated in response to the actuation of said sixth means.

6. A printed circuit board as claimed in claim 3, wherein said first logic circuit includes a plurality of gate circuits connected with said electronic circuit to permit passage of an information signal to be exchanged between said electronic circuit and said bus line, and connecting means for disconnectably connecting the individual ones of said gate circuits with said bus line to permit passage of said information signal through said gate circuits, said second externally grounding means including a first flip-flop changeable between a first state and a second state, and means for changing said first flip-flop from the first state to the second state in response to the demand for the insertion or withdrawal of said printed circuit board on on-line status, said first flip-flop generating said first output signal which has a logical level "1" when it is in said first state and a logical level "0" when it is said second state, said third logic circuit generating said second output signal which has logical level "0" in the presence of said information exchange and a logical level "1" in the absence of said information exchange, and said fourth logic circuit includes an AND gate receiving said first output signal from said first flip-flop and said second output signal from said third logic circuit, and a second flip-flop having a first input receiving the output signal of said AND gate and a second input receiving an inverted equivalent of said first output signal from said first flip-flop, said second flip-flop generating said third output signal which takes a logical level "0" in response to the application of the signal of logical level "1" to said first input and takes a logical level "1" in response to the application of the signal of logical level "1" to said second input, the passage of said information signal through said individual gate circuits included in said first logic circuit being controlled by said third output signal from said second flip-flop and depending upon the operating state of said second externally grounding means.

7. A printed circuit board as claimed in claim 6, wherein said means for changing the state of said first flip-flop is switch means for selectively connecting said internal grounding circuit with said first and second inputs of said first flip-flop in response to the demand for the insertion or withdrawal of said printed circuit board on on-line status.

8. A printed circuit board as claimed in claim 6, wherein said printed circuit board comprises seventh means actuated in response to the output signal of said fourth logic circuit for visually displaying the presence of said output signal, and said fifth means includes a light emitting diode connected at one end thereof with the output of said second flip-flop, and means for applying a predetermined voltage to the other end of said light emitting diode, said light emitting diode being actuated to emit light when said third signal from said second flip-flop takes a logical level 37 0".

9. A printed circuit board as claimed in claim 1, wherein an external signal indicating the fact that said printed circuit board is exchanging information with the other unit connected with said bus line is applied to said third means through a control signal line element included in said bus line.

10. A printed circuit board as claimed in claim 1, wherein an external signal indicating the fact that said printed circuit board is exchanging information with the other unit connected with said bus line is applied to said third means through a control signal line provided separately from said bus line.

11. A printed circuit board as claimed in claim 1, further comprising means for connecting electrically said electronic circuit with an external power supply line.

* * * * *